US012619075B2

(12) United States Patent
Effinger et al.

(10) Patent No.: US 12,619,075 B2
(45) Date of Patent: May 5, 2026

(54) FIBRE COUPLE LIGHT ENGINE

(71) Applicant: GOOGLE LLC, Mountain View, CA (US)

(72) Inventors: Daniel J. Effinger, Hamilton (CA); Benjamin Wales, Waterloo (CA)

(73) Assignee: GOOGLE LLC, Mountain View, CA (US)

( * ) Notice: Subject to any disclaimer, the term of this patent is extended or adjusted under 35 U.S.C. 154(b) by 1078 days.

(21) Appl. No.: 17/522,220

(22) Filed: Nov. 9, 2021

(65) Prior Publication Data

US 2022/0299769 A1 Sep. 22, 2022

Related U.S. Application Data

(60) Provisional application No. 63/111,295, filed on Nov. 9, 2020.

(51) Int. Cl.
| | |
|---|---|
| *G02B 27/01* | (2006.01) |
| *F21V 8/00* | (2006.01) |
| *H01S 5/02251* | (2021.01) |
| *H01S 5/02253* | (2021.01) |
| *H01S 5/40* | (2006.01) |

(52) U.S. Cl.
CPC ....... *G02B 27/0172* (2013.01); *G02B 6/0016* (2013.01); *G02B 6/0035* (2013.01); *H01S 5/02251* (2021.01); *H01S 5/02253* (2021.01); *H01S 5/4012* (2013.01); *G02B 2027/0178* (2013.01)

(58) Field of Classification Search
CPC . G02B 6/4262; G02B 27/102; H01S 5/02251; H01S 5/02253; H01S 5/4012
See application file for complete search history.

(56) References Cited

U.S. PATENT DOCUMENTS

| | | | |
|---|---|---|---|
| 2016/0026253 A1* | 1/2016 | Bradski | H04N 13/128 |
| | | | 345/8 |
| 2019/0086618 A1* | 3/2019 | Shastri | H01R 12/721 |

\* cited by examiner

*Primary Examiner* — Xinning(Tom) Niu

(57) ABSTRACT

A light engine includes multiple laser diodes, each configured to emit laser light, and a light source unit having multiple channels, each of the channels is associated with one of the laser diodes and configured to transmit the laser light emitted from the corresponding laser diode. The channels may be, for example, fiber optic strands or optical pathways within a channeled lightguide. The light engine further includes a ferrule coupled to the light source unit and configured to receive the laser light from the light source unit and to output a collimated beam of laser light comprising each wavelength of laser light emitted by the laser diodes.

20 Claims, 4 Drawing Sheets

FIBRE COUPLE LIGHT ENGINE

BACKGROUND

In the field of optics, a combiner is an optical apparatus that combines two light sources, for example, environmental light from outside of the combiner and light transmitted from a micro-display and directed to the combiner via a waveguide. Optical combiners are used in wearable heads up displays (WHUDs), sometimes referred to as head-mounted displays (HMDs) or near-eye displays, which allow a user to view computer-generated content (e.g., text, images, or video content) superimposed over a user's environment viewed through the WHUD, creating what is known as augmented reality (AR) or mixed reality (MR).

Some HMDs are designed to look like eyeglasses, with at least one combiner forming a lens of the eyeglasses, which are supported by a frame designed to be worn in front of a user's eyes to allow the user to view both their environment and computer-generated content projected from the combiner. Components which are necessary to the functioning of a typical HMD, such as, for example, a light engine to project computer-generated content, cameras to pinpoint physical location, cameras to track the movement of the user's eye(s), processors to power the light engine, and a power supply, are typically housed within the frame of the HMD. As an HMD frame has limited volume in which to accommodate these components, it is desirable that these components be as small as possible and configured to interact with the other components in very small volumes of space.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

In a conventional HMD light engine, light is emitted, collimated, and then combined by discrete components in an orthogonal manner requiring a cumbersome footprint (e.g., often at least 44 mm$^2$). For example, a typical laser-based light engine includes at least three laser diodes, each of which provides laser light to separate collimating lenses, which then transmit the collimated laser light to a combiner component with multiple reflective surfaces positioned so as to combine the collimated laser light into one beam. The combined beam, sometimes referred to as a red-green-blue (RGB) beam, may then be directed to other components of the system, such as to an optical relay or scanning micro-electromechanical system (MEMS) mirror, in order to transmit the laser light into a combiner of the HMD and, ultimately, to a user's eye to be viewed as virtual content overlaying their environment.

FIGS. 1-5 illustrate systems and methods of reducing the size and overall footprint of a light engine, for example a light engine of an HMD. The system includes a light source unit optically coupled to at least one light source, such as an edge-emitting laser diode, in order to transmit the light from the light source to a collimating lens element while reducing the overall footprint of the light engine. In an embodiment, the light source unit includes fiber optic strands, each of which is optically coupled to one light source. The fiber optic strands are bundled and terminate at a ferrule containing lens elements to combine the light from the individual fiber optic strands into a combined beam and to collimate the combined beam of light. In another embodiment, the light source unit is a lightguide having wavelength-specific channels (also referred to as a "channeled lightguide"), where each of the channels is optically coupled to a light source of the light engine in order to transmit the light from each light source to a region of the lightguide where the channels merge to combine the light from each light source into a combined beam before it is incident on a collimating lens element optically coupled to the lightguide.

Figure 1:
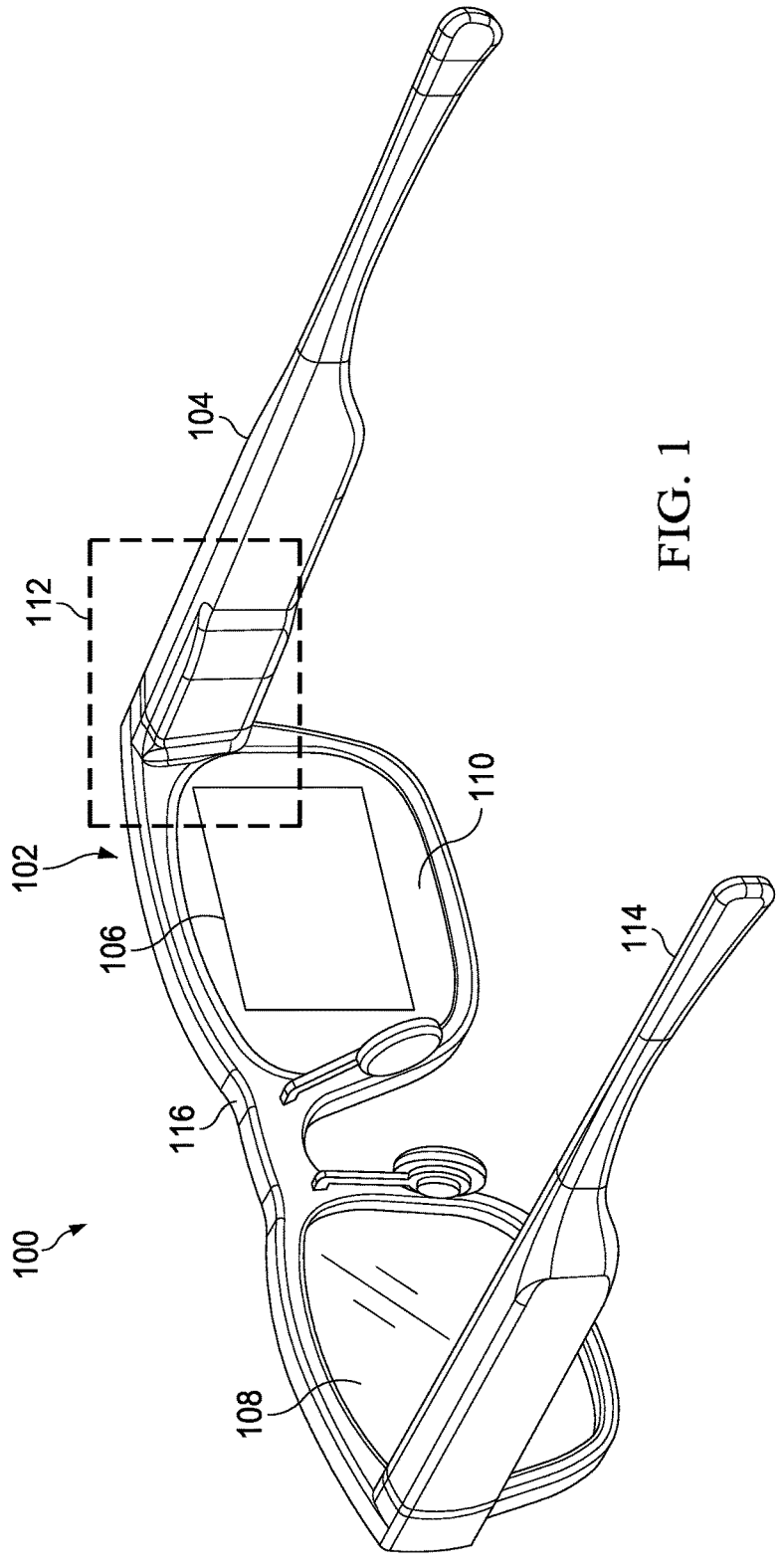
FIG. 1 shows an example display system employing a scanning-based optical system, in accordance with some embodiments.

FIG. 1 illustrates an example display system 100 employing a scanning-based optical system having a support structure 102 that includes an arm 104, which houses a laser projection system configured to project images toward the eye of a user, such that the user perceives the projected images as being displayed in a field of view (FOV) area 106 of a display at one or both of lens elements 108, 110 in accordance with some embodiments. In the depicted embodiment, the display system 100 is a near-eye display system in the form of an HMD in which the support structure 102 is configured to be worn on the head of a user and has a general shape and appearance (that is, form factor) of an eyeglasses (e.g., sunglasses) frame. The support structure 102 contains or otherwise includes various components to facilitate the projection of such images toward the eye of the user, such as a light engine, an optical scanner, and a waveguide. In some embodiments, the support structure 102 further includes various sensors, such as one or more front-facing cameras, rear-facing cameras, other light sensors, motion sensors, accelerometers, and the like. The support structure 102 further can include one or more radio frequency (RF) interfaces or other wireless interfaces, such as a Bluetooth™ interface, a WiFi interface, and the like. Further, in some embodiments, the support structure 102 includes one or more batteries or other portable power sources for supplying power to the electrical components of the display system 100. In some embodiments, some or all of these components of the display system 100 are fully or partially contained within an inner volume of support structure 102, such as within the articulating arm 104 in region 112 of the support structure 102. In some embodiments, both arms 104 and 114 articulate around a hinge (not shown) connecting the arms 104 and 114 to a front portion 116 of the support structure. It should be noted that while an example form factor is depicted, it will be appreciated that in other embodiments the display system 100 may have a different shape and appearance from the eyeglasses frame depicted in FIG. 1.

One or both of the lens elements 108, 110 are used by the display system 100 to provide an augmented reality (AR) display in which rendered graphical content can be super-imposed over or otherwise provided in conjunction with a real-world view as perceived by the user through the lens elements 108, 110. For example, laser light used to form a perceptible image or series of images may be projected by a projector of the display system 100 onto the eye of the user via a series of optical elements, such as a waveguide formed at least partially in the corresponding lens element, one or more scan mirrors, and one or more optical relays. One or both of the lens elements 108, 110 thus include at least a portion of a waveguide that routes display light received by an incoupler of the waveguide to an outcoupler of the waveguide, which outputs the display light toward an eye of a user of the display system 100. The display light is modulated and scanned onto the eye of the user such that the user perceives the display light as an image. In addition, each of the lens elements 108, 110 is sufficiently transparent to allow a user to see through the lens elements to provide a field of view of the user's real-world environment such that the image appears superimposed over at least a portion of the real-world environment.

In some embodiments, the projector is a digital light processing-based projector, a scanning laser projector, or any combination of a modulative light source such as a laser or one or more light-emitting diodes (LEDs) and a dynamic reflector mechanism such as one or more dynamic scanners or digital light processors. In some embodiments, the pro-jector includes multiple laser diodes (e.g., a red laser diode, a green laser diode, and a blue laser diode) and at least one scan mirror (e.g., two one-dimensional scan mirrors, which may be micro-electromechanical system (MEMS)-based or piezo-based). The projector is communicatively coupled to the controller and a non-transitory processor-readable stor-age medium or memory storing processor-executable instructions and other data that, when executed by the controller, cause the controller to control the operation of the projector. In some embodiments, the controller controls a scan area size and scan area location for the projector and is communicatively coupled to a processor (not shown) that generates content to be displayed at the display system 100. The projector scans light over a variable area, designated the FOV area 106, of the display system 100. The scan area size corresponds to the size of the FOV area 106 and the scan area location corresponds to a region of one of the lens elements 108, 110 at which the FOV area 106 is visible to the user. Generally, it is desirable for a display to have a wide FOV to accommodate the outcoupling of light across a wide range of angles. Herein, the range of different user eye positions that will be able to see the display is referred to as the eyebox of the display.

In some embodiments, the projector routes light via first and second scan mirrors, an optical relay disposed between the first and second scan mirrors, and a waveguide disposed at the output of the second scan mirror. In some embodi-ments, at least a portion of an outcoupler of the waveguide may overlap the FOV area 106. These aspects are described in greater detail below. While the disclosed systems and techniques are generally described as being implemented in an example HMD, it is understood that a light engine having a reduced footprint may be implemented in a variety of projection systems.

Figure 2:
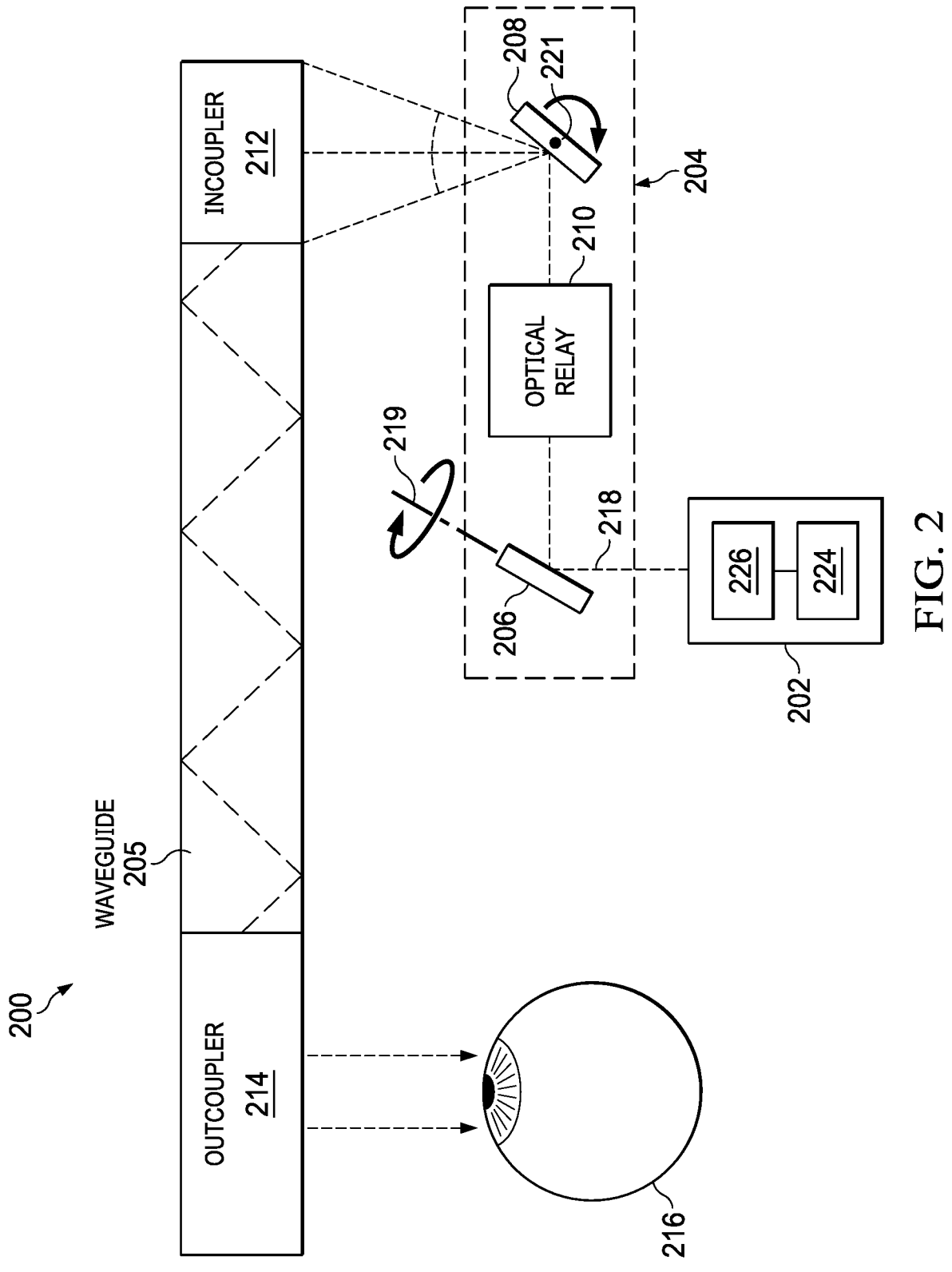
FIG. 2 illustrates a block diagram of a laser projection system that projects images directly onto the eye of a user via laser light and which can be implemented in a display system such as that shown in FIG. 1, in accordance with some embodiments.

FIG. 2 illustrates a block diagram of a laser projection system 200 that projects images directly onto the eye of a user via laser light. The laser projection system 200 includes a light engine 202, an optical scanner 204, and a waveguide 205. The optical scanner 204 includes a first scan mirror 206, a second scan mirror 208, and an optical relay 210. The waveguide 205 includes an incoupler 212 and an outcoupler 214, with the outcoupler 214 being optically aligned with an eye 216 of a user in the present example. In some embodi-ments, the laser projection system 200 is implemented in a wearable heads-up display or other display system, such as the display system 100 of FIG. 1.

The light engine 202 includes a light source unit 224 having one or more laser light sources configured to gener-ate and output laser light 218 (e.g., visible laser light such as red, blue, and green laser light and, in some embodiments, non-visible laser light such as infrared laser light). In some embodiments, the light engine 202 is coupled to a driver or other controller (not shown), which controls the timing of emission of laser light from the laser light sources of the light engine 202 in accordance with instructions received by the controller or driver from a computer processor coupled thereto to modulate the laser light 218 to be perceived as images when output to the retina of an eye 216 of a user. The light engine 202 also includes a ferrule 226 optically coupled to the light source unit 224. The ferrule 226 contains a combiner element and/or a collimating lens, as described further with reference to FIG. 3.

During operation of the laser projection system 200, multiple laser light beams having respectively different wavelengths are output by the laser light sources of the light engine 202, then combined and/or collimated, before being directed to the eye 216 of the user. The light engine 202 modulates the respective intensities of the laser light beams so that the combined laser light reflects a series of pixels of an image, with the particular intensity of each laser light beam at any given point in time contributing to the amount of corresponding color content and brightness in the pixel being represented by the combined laser light at that time.

One or both of the first and second scan mirrors 206 and 208 of the optical scanner 204 are MEMS mirrors in some embodiments. For example, the first scan mirror 206 and the second scan mirror 208 are MEMS mirrors that are driven by respective actuation voltages to oscillate during active operation of the laser projection system 200, causing the first and second scan mirrors 206 and 208 to scan the laser light 218. Oscillation of the first scan mirror 206 causes laser light 218 output by the light engine 202 to be scanned through the optical relay 210 and across a surface of the second scan mirror 208. The second scan mirror 208 scans the laser light 218 received from the first scan mirror 206 toward an incoupler 212 of the waveguide 205. In some embodiments, the first scan mirror 206 oscillates or otherwise rotates around a first axis 219, such that the laser light 218 is scanned in only one dimension (i.e., in a line) across the surface of the second scan mirror 208. In some embodi-ments, the second scan mirror 208 oscillates or otherwise rotates around a second axis 221. In some embodiments, the first axis 219 is skewed with respect to the second axis 221.

In some embodiments, the incoupler 212 has a substan-tially rectangular profile and is configured to receive the laser light 218 and direct the laser light 218 into the waveguide 205. In an embodiment, the optical relay 210 is a line-scan optical relay that receives the laser light 218 scanned in a first dimension by the first scan mirror 206 (e.g., the first dimension corresponding to the small dimension of the incoupler 212), routes the laser light 218 to the second scan mirror 208, and introduces a convergence to the laser light 218 (e.g., via collimation) in the first dimension to an exit pupil plane of the optical relay 210 beyond the second scan mirror 208. Herein, an "exit pupil plane" in an optical system refers to the location along the optical path where light converges to a virtual aperture before exiting the optical system. For example, the possible optical paths of the laser light 218, following reflection by the first scan mirror 206, are initially spread along a first scanning axis, but later these paths intersect at an exit pupil beyond the second scan mirror 208 due to convergence introduced by the optical relay 210. The width (i.e., smallest dimension) of a given exit pupil approximately corresponds to the diameter of the laser light corresponding to that exit pupil. Accordingly, the exit pupil can be considered a "virtual aperture". In some embodiments, the exit pupil plane of the optical relay 210 is coincident with the incoupler 212. In some embodiments, an entrance pupil plane of the optical relay 210 is coincident with the first scan mirror 206.

According to various embodiments, the optical relay 210 includes one or more spherical, aspheric, parabolic, or freeform lenses that shape and relay the laser light 218 on the second scan mirror 208 or includes a molded reflective relay that includes two or more optical surfaces that include, but are not limited to, spherical, aspheric, parabolic, or freeform lenses or reflectors (sometimes referred to as "reflective surfaces" herein), which shape and direct the laser light 218 onto the second scan mirror 208. The second scan mirror 208 receives the laser light 218 and scans the laser light 218 in a second dimension, the second dimension corresponding to the long dimension of the incoupler 212 of the waveguide 205. In some embodiments, the second scan mirror 208 causes the exit pupil of the laser light 218 to be swept in a line along the second dimension. In some embodiments, the incoupler 212 is positioned at or near the swept line downstream from the second scan mirror 208 such that the second scan mirror 208 scans the laser light 218 as a line or row over the incoupler 212.

In some embodiments, the light engine 202 includes an edge-emitting laser (EEL) that emits a laser light 218, and the optical relay 210 magnifies or minimizes the laser light 218 along one or both of a first direction (e.g., the semi-major axis of the beam profile of the laser light 218) or a second direction (e.g., the semi-minor axis of the beam profile of the laser light 218) to circularize the laser light 218 prior to convergence of the laser light 218 on the second scan mirror 208.

The waveguide 205 of the laser projection system 200 includes the incoupler 212 and the outcoupler 214. The term "waveguide," as used herein, will be understood to mean a combiner using one or more of total internal reflection (TIR), specialized filters, or reflective surfaces, to transfer light from an incoupler (such as the incoupler 212) to an outcoupler (such as the outcoupler 214). In some display applications, the light is a collimated beam, and the waveguide transfers and replicates the collimated beam to the eye. In general, the terms "incoupler" and "outcoupler" will be understood to refer to any type of optical grating structure, including, but not limited to, diffraction gratings, holograms, holographic optical elements (e.g., optical elements using one or more holograms), volume diffraction gratings, volume holograms, surface relief diffraction gratings, or surface relief holograms. In the present example, the laser light 218 received at the incoupler 212 is relayed to the outcoupler 214 via the waveguide 205 using TIR. The laser light 218 is then output to the eye 216 of a user via the outcoupler 214. As described above, in some embodiments the waveguide 205 is implemented as part of an eyeglass lens, such as the lens 108 or lens 110 (FIG. 1) of the display system 100 having an eyeglass form factor and employing the laser projection system 200.

Figures 3, 4:
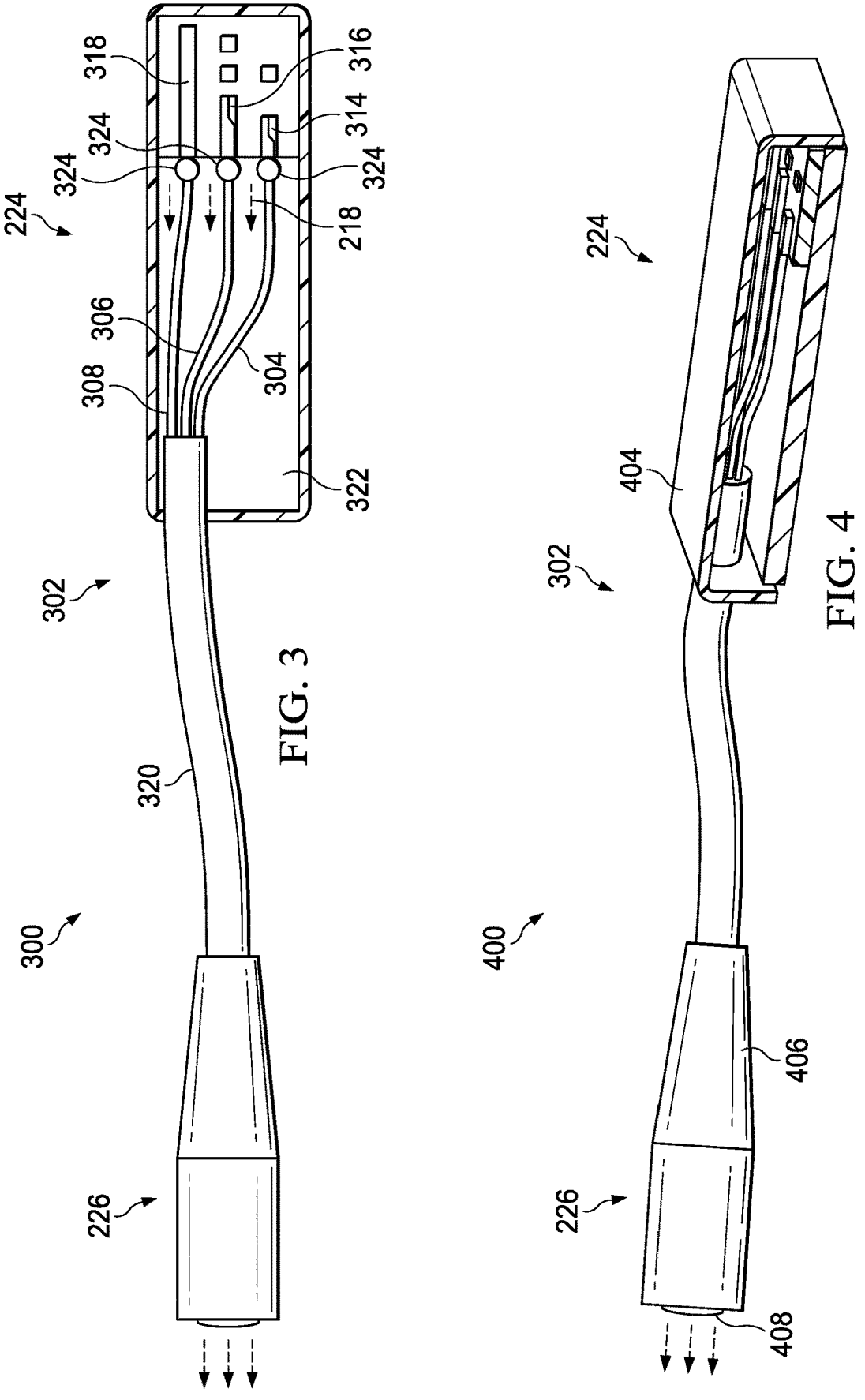
FIG. 3 shows a top view of a light engine including fiber optic strands optically coupled to laser diodes which can be employed in a laser projection system such as that shown in FIG. 2, in accordance with some embodiments.
FIG. 4 shows a partial cut-away, perspective view of the light engine of FIG. 3, including in a hermetic housing, in accordance with some embodiments.

FIG. 3 shows a top view 300 of a light engine 302 including light source unit 224 optically coupled to ferrule 226. The light source unit 224 contains fiber optic strands 304, 306, 308 optically coupled to laser diodes 314, 316, 318. The fiber optic strands 304, 306, 308 also optically couple the light source unit 224 to ferrule 226. The fiber optic strands 304, 306, 308 are channels through which light emitted by the laser diodes 314, 316, 318 is transmitted with high efficiency. In an embodiment, the fiber optic strands 304, 306, 308 are bound together to form a fiber optic bundle 320. In some embodiments, light engine 302 is housed within arm 104 of display system 100 within region 112 of FIG. 1. However, it should be understood that due to the flexible nature of the fiber optic strands 304, 306, 308 and the small footprint of the light engine 302, the light source unit 224 and ferrule 226 of the light engine 302 can be housed nearly anywhere within the support structure 102 (FIG. 1) and at any distance from one another, depending on design considerations. For example, in an embodiment, light source unit 224 is housed within arm 104 of the support structure 102 while the ferrule 226 is housed within the front portion 116 of the support structure.

Light source unit 224 includes laser diodes 314, 316, 318 that are mounted to a substrate 322, such as ceramic. To prevent heat damage to the light engine 302 or other components, the laser diodes 314, 316, 318 are thermally sunk into the substrate 322. In the present example, each laser diode is configured to emit light of a unique wavelength or range of wavelengths relative to the other laser diodes. For example, laser diode 314 is configured to emit laser light of within a range of wavelengths between 750 nm and 590 nm, which generally corresponds to red light, laser diode 316 is configured to emit laser light within a range of wavelengths between 591 nm and 495 nm, which generally corresponds to green light, and laser diode 318 is configured to emit laser light within a range of wavelengths between 496 nm and 380 nm, which generally corresponds to blue light. While the present example includes three laser diodes, it should be noted that any number of laser diodes may be included in light engine 302 depending on design considerations.

Each of fiber optic strands 304, 306, 308 is optically coupled to one of laser diodes 314, 316, or 318 and optimized to transmit the laser light of the specific wavelength (or range of wavelengths) emitted by the corresponding laser diode 314, 316, 318 to which it is coupled. In some embodiments, to maximize the efficiency of the optical coupling of the fiber optic strands 304, 306, 308 to their respective laser diodes 314, 316, or 318, the fiber optic strands 304, 306, 308 are configured with lensing at the end of the strand most proximate to the laser diodes. For example, fiber optic strands 304, 306, 308 are lensed and metalized single mode fibers (SMF), with the lensing providing highly efficient coupling of laser light from the diodes into the strands and the metalization providing for convenient and efficient bonding of the fiber optic strands 304, 306, 308 to substrate 322. In some embodiments, fiber optic strands 304, 306, 308 are coupled to their respective laser diodes 314, 316, or 318 via lenses 324, which have aspheric and/or anamorphic properties that provide efficient coupling.

FIG. 4 shows a partial cut-away, perspective view 400 of the light engine 302, with the light source unit 224 enclosed in a hermetic housing 404. The hermetic housing 404 protects the laser diodes 314, 316, 318 from environmental contamination. The fiber optic bundle 320 is also partially contained by the hermetic housing 404 but extends outside of the hermetic housing 404 to connect the light source unit 224 to the ferrule 226, which contains an optical combiner element 406 to combine the light from each of the fiber optic strands 304, 306, 308 and a collimating lens 408 to collimate the combined light as it exits the ferrule 226. The collimated combined light output by the ferrule 226 may be directed to other components of the display system 100, such as a MEMS mirror 206, 208, or optical relay 210 of the optical scanner 204.

Figure 5:
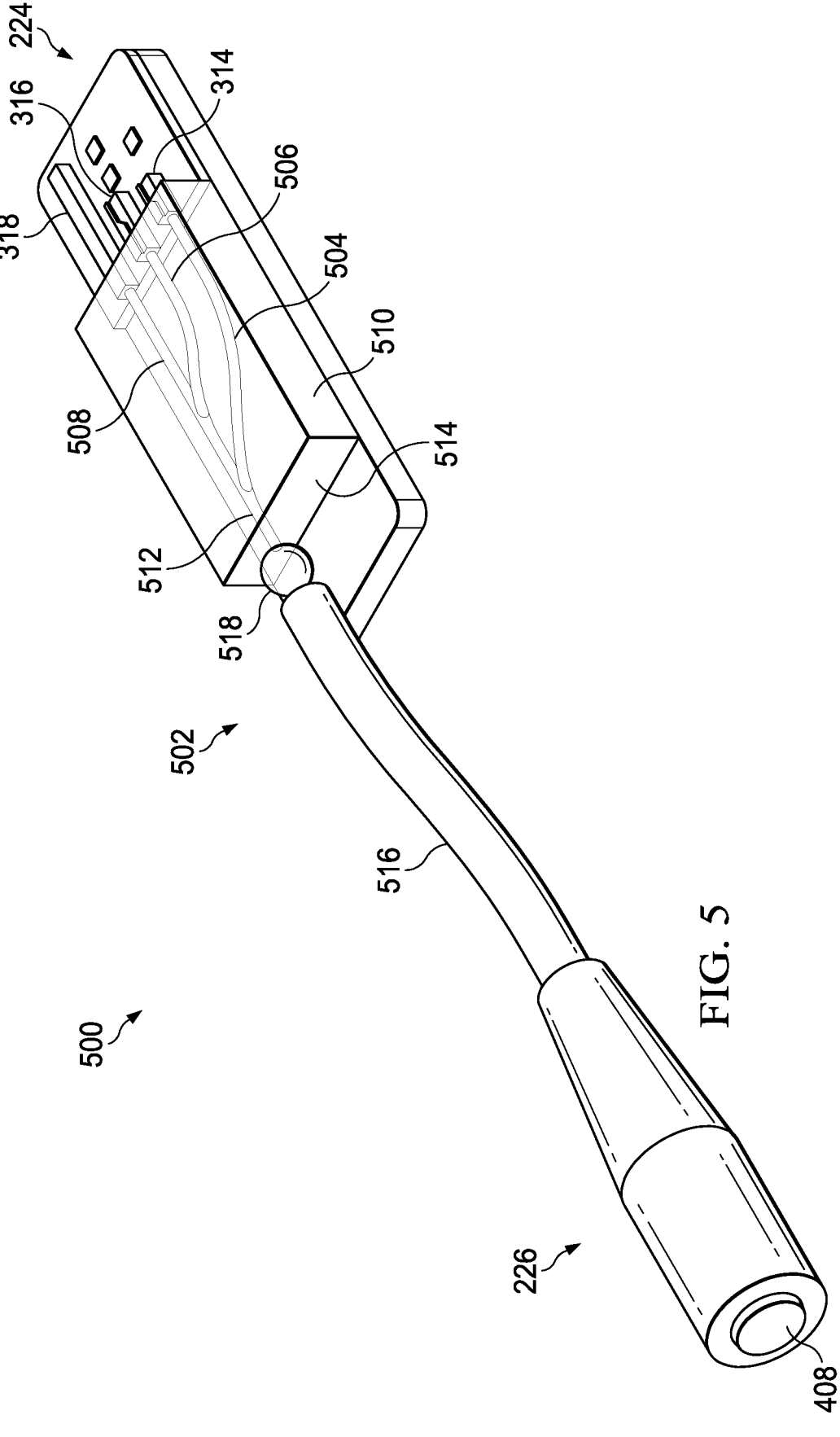
FIG. 5 shows a top perspective view of a light engine employing a channeled waveguide optically coupled to laser diodes which can be employed in a laser projection system such as that shown in FIG. 2, in accordance with some embodiments.

FIG. 5 shows a top perspective view 500 of a light engine 502 employing a channeled waveguide 510 optically coupled to laser diodes 314, 316, 318. Light engine 502 includes a light source unit 224, including channeled waveguide 510, coupled to a ferrule 226 via at least one fiber optic strand 516. The channeled waveguide 510 is an optical channeling system similar in concept to fiber optic strands, except that the light transport occurs in a medium tailored to transmission of a specific wavelength of light rather than within the core of a fiber optic strand. Channeled waveguide 510 includes channels 504, 506, 508, each having a cross-section specifically designed to transmit laser light emitted by the corresponding laser diode 314, 316, 318 to which it is optically coupled. Channels 504, 506, 508 are tube-like structures of higher index medium formed in the substrate of the waveguide. That is, channels 504, 506, 508 are formed by structured index differences in the heterogeneous waveguide 510.

Channels 504, 506, 508 converge to form an output channel 512 near the distal end 514 of the channeled waveguide 510 in order to combine the light transmitted by each of the channels 504, 506, 508 to create a combined beam. The output channel 512 is optically coupled to fiber optic strand 516. In some embodiments, the output channel 512 is optically coupled to the fiber optic strand 516 via a ball lens 518. In other embodiments, the output channel 512 is optically coupled to the fiber optic strand 516 via a lensed end of the fiber optic strand 516. In other embodiments, the output channel 512 is optically coupled to the fiber optic strand 516 by virtue of abutting the end of the fiber optic strand 516 against the output channel 512, without any intervening lens elements.

Fiber optic strand 516 connects the light source unit 224 to the ferrule 226, which includes collimating lens 408 to collimate the light transmitted to the ferrule 226 via the fiber optic strand 516. The collimated combined light output by the ferrule 226 may be directed to other components of the display system 100, such as a MEMS mirror 206, 208, or optical relay 210. In some embodiments, similar to light engine 302, the channeled waveguide 510, laser diodes 314, 316, 318, and a portion of the fiber optic strand 516 are encased in hermetic housing 324 to protect the laser diodes 314, 316, 318 from environmental contamination.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A light engine comprising:
   a plurality of laser diodes, each laser diode of the plurality of laser diodes configured to emit laser light representative of at least a portion of an image to be displayed;
   a light source unit comprising a plurality of structures formed in a substrate of a waveguide, the plurality of structures being formed from areas of the substrate having a higher index of refraction than at least a portion of the substrate outside the areas and the plurality of structures forming a plurality of channels with, each channel of the plurality of channels being associated with one of the plurality of laser diodes and configured to transmit the laser light emitted from the corresponding laser diode; and an output channel formed from a convergence of the plurality of channels and configured to receive the laser light from each channel of the plurality of channels.

2. The light engine of claim 1, further comprising a fiber optic strand optically coupling the light source unit to a ferrule.

3. The light engine of claim 2, wherein the ferrule comprises a collimating lens.

4. The light engine of claim 1, wherein the light source unit is contained in a hermetic housing.

5. The light engine of claim 1, further comprising:

a fiber optic strand disposed between the output channel and a ferrule, the fiber optic strand configured to optically connect the output channel to the ferrule.

6. The light engine of claim 5, further comprising:

a ball lens configured to direct light from the output channel into the fiber optic strand.

7. The light engine of claim 1, wherein a channel of the plurality of channels is configured to combine the laser light emitted from two or more laser diodes of the plurality of laser diodes.

8. A head-mounted display (HMD) system comprising:

a support structure having a front portion and at least one arm; and a light engine, housed within the support structure, comprising:

a light source unit comprising:

a plurality of laser diodes with each laser diode of the plurality of laser diodes configured to emit laser light representative of at least a portion of an image to be displayed;

a plurality of structures formed in a substrate of a waveguide, the plurality of structures being formed from areas of the substrate having a higher index of refraction than at least a portion of the substrate outside the areas and the plurality of structures forming a plurality of channels with; each channel of the plurality of channels being associated with one of the plurality of laser diodes and configured to transmit the laser light emitted from the corresponding laser diode; and an output channel formed from a convergence of the plurality of channels and configured to receive the laser light from each channel of the plurality of channels.

9. The HMD system of claim 8, wherein the light source unit is housed within the at least one arm and a ferrule connected to the light engine is housed within the front portion of the support structure.

10. The HMD system of claim 8, further comprising a fiber optic strand optically coupling the light source unit to a ferrule.

11. The HMD system of claim 10, wherein the ferrule comprises a collimating lens.

12. The HMD system of claim 8, wherein the light source unit is contained in a hermetic housing.

13. The HMD system of claim 10, wherein the ferrule is positioned to transmit collimated light to an optical relay housed within the support structure.

14. The HMD of claim 8, wherein the light engine further comprises a fiber optic strand disposed between the output channel and a ferrule, the fiber optic strand configured to optically connect the output channel to the ferrule.

15. The HMD of claim 14, wherein the light engine further comprises a ball lens configured to direct light from the output channel into the fiber optic strand.

16. The HMD of claim 8, wherein a channel of the plurality of channels is configured to combine the laser light emitted from two or more laser diodes of the plurality of laser diodes.

17. A method comprising:

providing light emitted from each laser diode of a plurality of laser diodes of a light engine to a corresponding channel of a plurality of channels, the plurality of channels comprising a plurality of structures formed in a substrate of a waveguide, wherein the plurality of structures are formed from areas of the substrate having a higher index of refraction than a portion of the substrate outside the areas; and providing the light from each channel of the plurality of channels to an output channel formed from a convergence of the plurality of channels.

18. The method of claim 17, further comprising:

providing light from the output channel to a ball lens.

19. The method of claim 18, further comprising:

directing, via the ball lens, the light from the output channel to at least one fiber optic strand.

20. The method of claim 17, wherein the plurality of laser diodes is disposed within a hermetic housing.

* * * * *